United States Patent [19]
Pearson

[11] 3,983,478
[45] Sept. 28, 1976

[54] MOVING COIL INSTRUMENT HAVING ELECTRICALLY CONDUCTIVE COIL FORM PARTS CONNECTED TO THE COIL

[75] Inventor: David B. Pearson, Raritan, N.J.

[73] Assignee: Weston Instruments, Inc., Newark, N.J.

[22] Filed: Dec. 12, 1974

[21] Appl. No.: 532,246

Related U.S. Application Data

[62] Division of Ser. No. 391,496, Aug. 24, 1973, Pat. No. 3,882,389, which is a division of Ser. No. 173,425, Aug. 20, 1971, Pat. No. 3,764,909.

[52] U.S. Cl............................ 324/154 R; 324/125
[51] Int. Cl.² ...................... G01R 5/02; G01R 1/04; G01R 1/14
[58] Field of Search................ 324/150, 151, 154 R, 324/154 PB, 125

[56] References Cited
UNITED STATES PATENTS

| | | | |
|---|---|---|---|
| 2,045,677 | 6/1936 | Schock | 324/154 R |
| 3,406,340 | 10/1968 | Seibel | 324/154 R |
| 3,551,812 | 12/1970 | Mothes | 324/154 R X |
| 3,597,686 | 8/1971 | Kain | 324/154 R |

Primary Examiner—Gerard R. Strecker
Attorney, Agent, or Firm—W. R. Sherman; Walter Kruger; Kevin McMahon

[57] ABSTRACT

An electric meter particularly characterized by a small number of moving parts and simplified assembly. A coil assembly initially including integral support elements which permit connection of pivot bearings or taut bands is adapted to be accurately positioned for rotation on the supporting base by inserting the assembly into the base. Cooperating locating surfaces on the base and coil assembly provide for accurate positioning of the support elements so the axis of rotation of the coil is in a predetermined position relative to a magnetic circuit of the meter. After insertion of the coil assembly, the bridging elements are severed. A coil support form of unique construction includes motion limiting elements which cooperate with surfaces of the magnetic circuit to limit the permissible extent of movement of the coil, in the event of shock or impact, to positions well within the elastic limit of the supports which mount the coil for rotation. The coil support halves connected together in electrically insulated relation to each other. Damping rings can be secured directly to the respective coil support halves, after the coil form is assembled.

23 Claims, 9 Drawing Figures

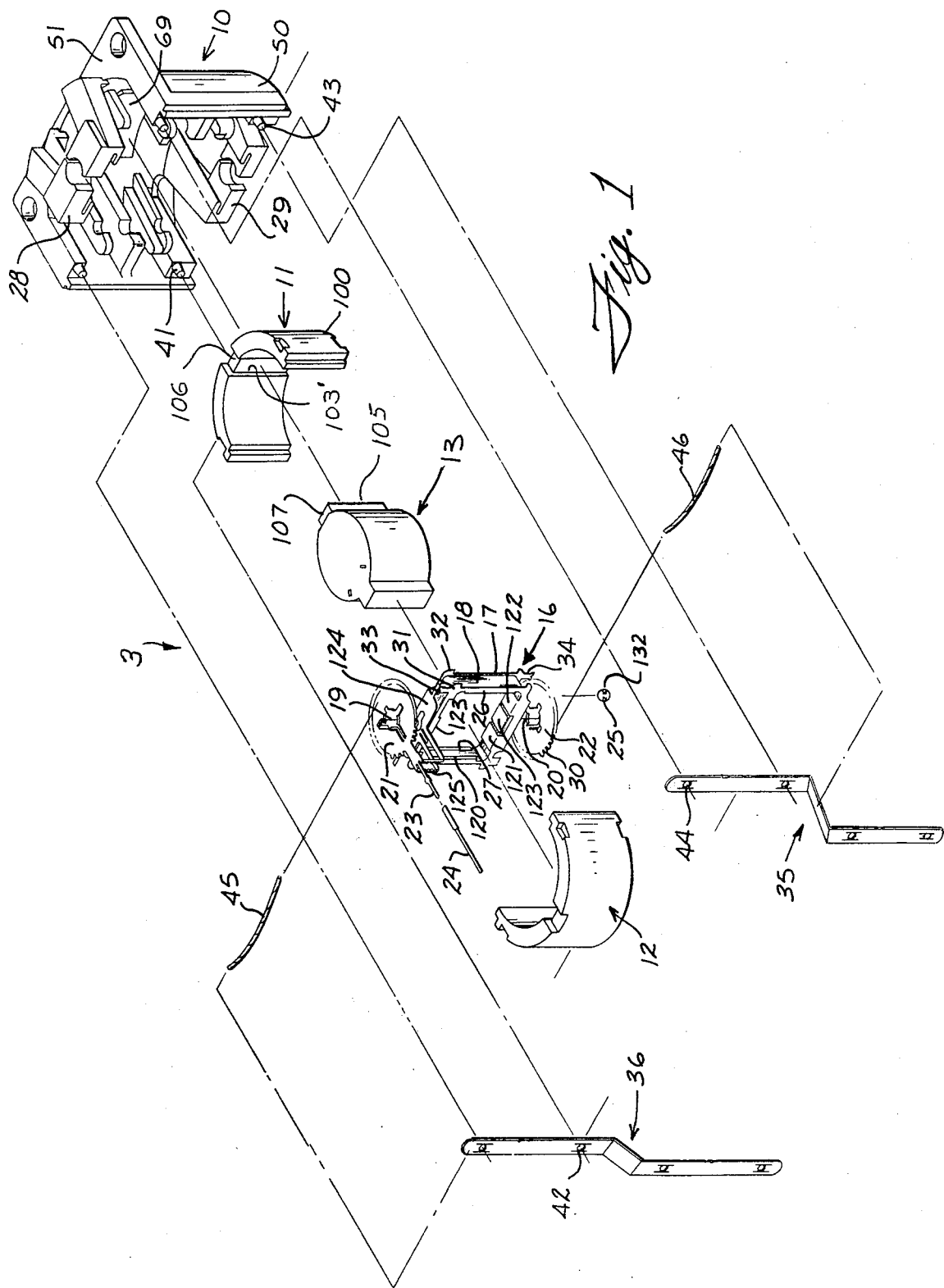

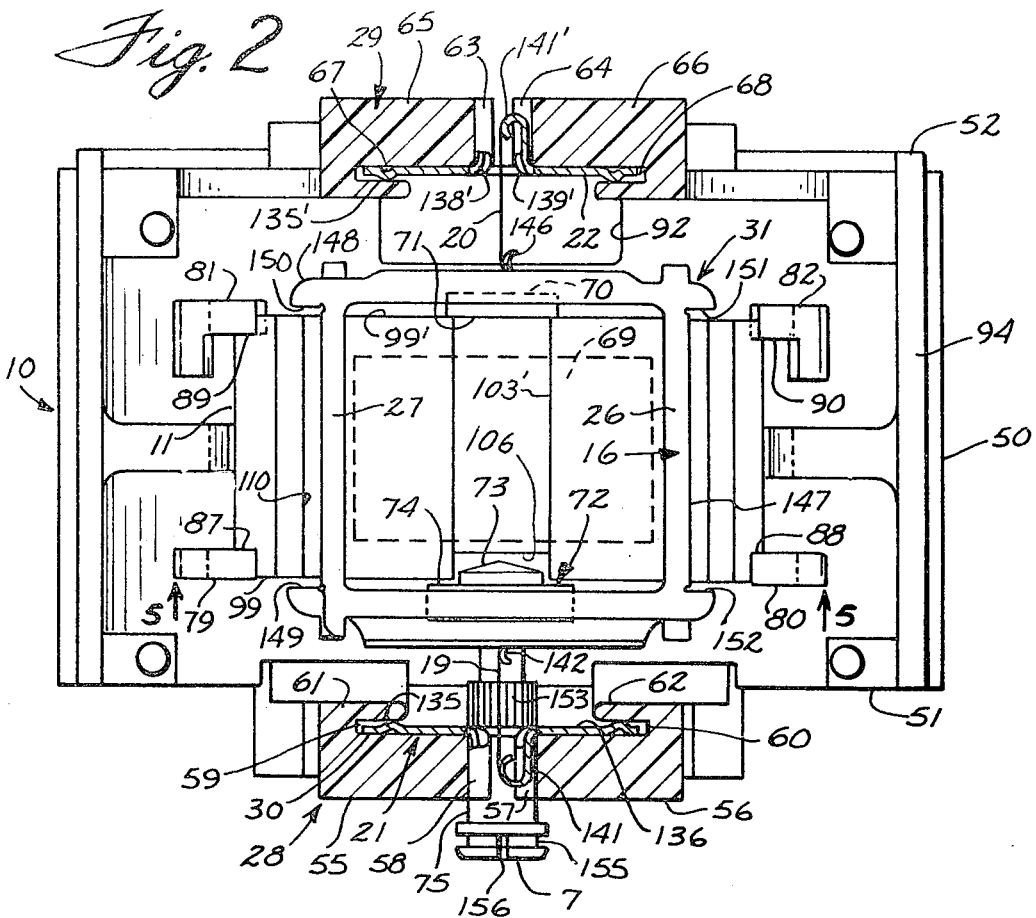

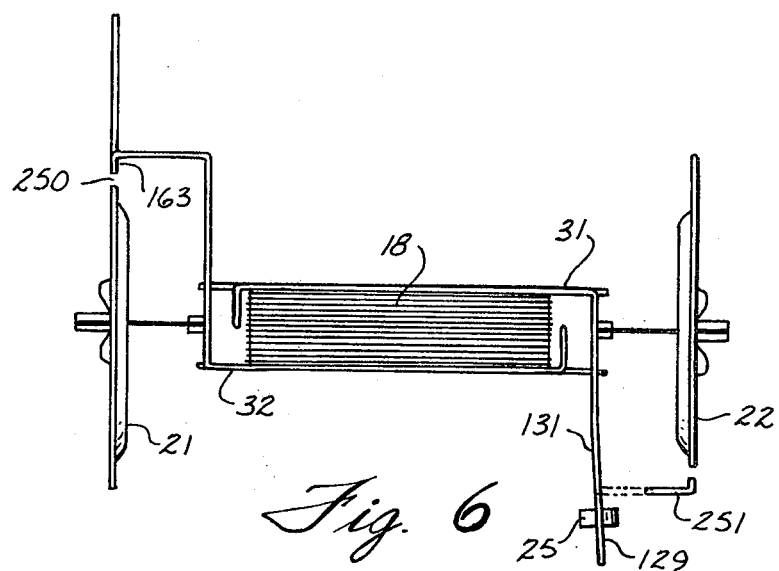
Fig. 6
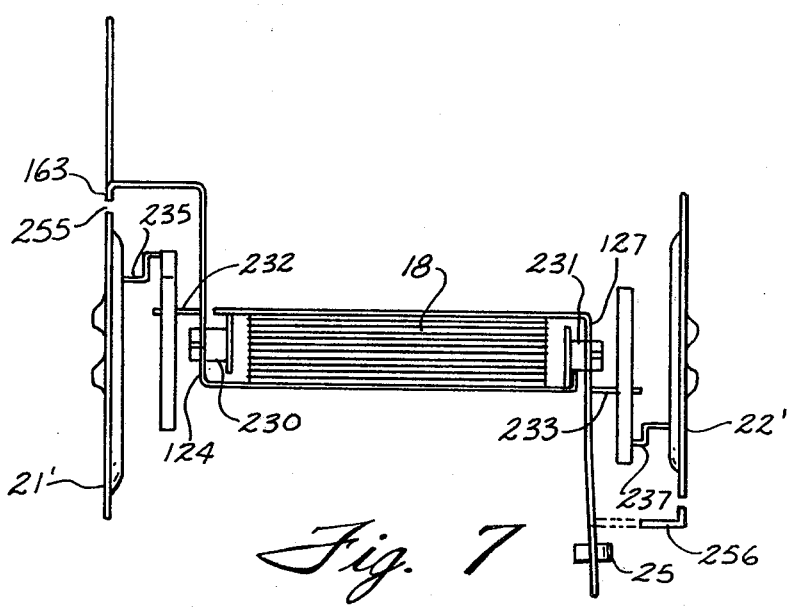
Fig. 7
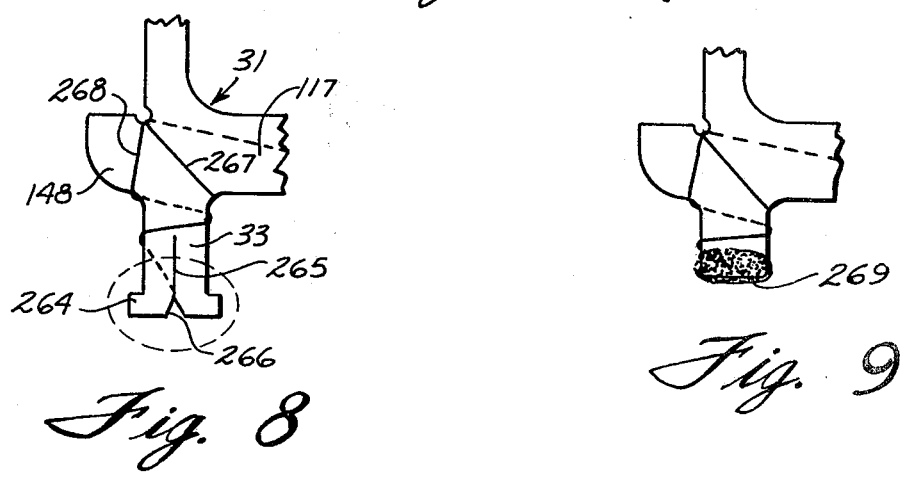
Fig. 8
Fig. 9

MOVING COIL INSTRUMENT HAVING ELECTRICALLY CONDUCTIVE COIL FORM PARTS CONNECTED TO THE COIL

This is a division of my copending application Ser. No. 391,496, filed Aug. 24, 1973, now U.S. Pat. No. 3,882,389, which is a division of application Ser. No. 173,425, filed Aug. 20, 1971, and which issued as U.S. Pat. No. 3,764,909 on Oct. 9, 1973.

This invention relates to an electric meter of the moving coil type which is particularly adapted for manufacture by mass production methods. The invention also relates to a unique moving coil construction, as an intermediate product of manufacture, wherein the coil frame has integrally attached support elements which are subsequently separated from the coil frame to provide supports for mounting the coil for pivotal movement on a supporting base. In addition, the invention permits a method of manufacturing both the moving coil and the meter including the coil, on a mass production basis using a minimum number of parts and assembly steps to provide an accurate instrument.

Because of the number of steps required to assemble and the number of parts required for constructing measuring instruments of the moving coil type such as D'Arsonval meters, such meters have not in the past been as capable of mass production manufacture as the meter of the present invention. Because of the large number of parts, and the numerous adjustments required, prior meters are relatively expensive. In these prior art meters, forming the various parts for the meter and assembling same to form the meter is quite time consuming. Typical steps required are forming the moving coil portion of the instrument, connecting suitable supports to the frame of the moving coil to support jewels or a taut band (depending on the suspension for the instrument) forming a casing, mounting the magnetic circuit for the meter in the casing, installing the moving coil, connecting taut bands or bearings to the moving coil to suspend the coil, aligning the suspension for the coil so the coil rotates about a predetermined axis, adjusting the magnetic circuit to provide a desired range of coil deflection characteristics, mounting a meter scale with appropriate indicia corresponding to the deflection characteristics of the meter, balancing the coil to compensate for the weight of the pointer, and zero adjusting the meter. In the past, the suspension of the coil on its base support has been accomplished manually and this step is quite time consuming since the coil must be carefully aligned with fixed connectors on the base support and various parts and pieces of the suspension are then connected to suspend or otherwise mount the coil for rotation. Then, because it is difficult to always mount a coil for rotation about the same axis in each and every assembly, it is necessary to adjust or reposition the magnetic circuit to compensate for slight differences in the location of the axis of rotation of the coil for successively assembled instruments of the same type. Finally, even after pointers and counter balance weights are connected to the moving coil, it is necessary to test the instrument to determine what the scale deflection characteristics of the meter are and then select from one of several scales a scale that accurately represents the deflection characteristics of the instrument. Correspondingly, the prior art meters simply have too many parts to permit economical assembly even by mass production methods. As a result it was quite expensive to provide a meter with an accuracy of for example, 2 percent of full scale deflection.

The meter and moving coil of this invention overcome many of the disadvantages of the prior art moving coil instruments. By virtue of its unique construction this meter uses only a small fraction of the number of parts required in previous meters. Since the number of parts is reduced, the number of assembly steps is correspondingly reduced with the result that the meter is well adapted to be manufactured on a mass production assembly line basis to provide an accurate meter with good tracking characteristics.

A substantial reduction of the number of parts required is obtained by virtue of a unique moving coil assembly manufactured in accordance with this invention. This coil assembly, in the preferred embodiment, includes two identical coil support forms of electrically conductive material which are of precision manufacture. Formed integral with these support forms are terminals for the coil wire to be wound on the forms. Also integral with the forms are the connecting and support elements which support the coil both at the coil form and in the supporting base of the assembled meter and to which the taut band or jewels are connected, a staff for subsequent connection of a pointer, and a serrated slot for connection of a counterbalance weight. In the taut band type of suspension the support element is also a zero adjust element. The support elements have locating surfaces for accurately positioning them on the base. Advantageously, the coil support forms are held together in insulated relation to each other by the wire which is wound on the supports to form the coil. Correspondingly, it is merely necessary to connect one end of the coil wire to one of the support forms and the other end of the coil wire to the other of the support forms whereupon, the necessary electrical connections to the coil can be subsequently made quite readily directly to the respective coil support elements.

An additional significant feature of the invention resides in the construction of the support elements for the coil assembly, at least one of the support elements having gear teeth formed thereon for direct engagement by a gear toothed zero adjust knob supported by the meter casing. Since the zero adjust spring, be it a spiral spring in the case of a pivot bearing support for the coil, or torsion spring in the case of a taut band suspension type support for the coil, is directly connected to the gear toothed zero adjust element, the number of parts required is reduced and the arrangement is simplified.

The coil frame is comprised of two similar halves which may be identical to reduce tooling costs. Each frame half has combined support and zero adjust elements as an integral part thereof. Immediately prior to assembly of the meter the support elements are severed from the coil assembly and the support elements are then merely inserted in the insulating material base to simultaneously position the support elements and mount the coil assembly for rotation.

The coil frame is further provided with stop surfaces which limit the extent of axial as well as transverse movement of the coil assembly to prevent damage to the suspension elements for the coil even though the meter is dropped or otherwise impacted. The stops are so arranged with respect to the magnetic circuit of the meter that the coil assembly cannot move to any position in which the elastic deformation of the elements which support the coil for rotation is exceeded.

An additional feature of the invention resides in a unique damping ring arrangement which can be used where it is desired to limit the rate of deflection of the coil assembly. By virtue of its construction and the manner in which the damping ring is connected to the coil assembly, the damping ring can be optionally provided at very little additional expense.

The insulated base of plastic material is so constructed that the base has flexibility which permits spreading apart plastic material bridge elements that support the coil assembly so the coil assembly and support elements can be readily positioned in the base.

With regard to construction economy, parts of the meter which are used in pairs, for example, the coil support forms and the split rings which form the yoke of the magnetic circuit, can be of identical construction so the total number of different precision parts is maintained at an absolute minimum. Moreover, these parts are so constructed relative to the parts with which they interengage and are connected that they can only be installed in one position, during the assembly of the meter. The parts will not fit unless they are properly oriented.

An additional significant advantage of the construction of the meter is that almost all of the same basic parts are used in the construction of a meter for jewelled (bearing) movement or taut band suspension. For example, using the same magnetic circuit, base support and coil support blanks, a meter of either the taut band suspension type or jewelled suspension type can be constructed merely by assembling the proper suspension elements at appropriate times during the manufacturing and assembly operations. However, most of the manufacturing steps for the meter for each type of suspension are the same and are accomplished in the same manner for both types of instruments.

As previously mentioned, a significant feature of the meter is the moving coil assembly wherein many of the separate elements of prior art meters are initially formed as an integral portion of the coil support. This integral structure is carefully formed so the position of the axis of rotation of the coil is predetermined relative to the integrally connected supports. Then, with the supports and coil in proper alignment, connections are severed which free the supports. However, prior to such severing, the coil and supports are mounted in a fixture which maintains these elements in predetermined aligned relation to each other, and the fixture assures that the coil and support elements are properly installed in the supporting base with the axis of rotation of the coil precisely the same relative to the base in each meter. As a result of this initial integral assembly many of the previous manufacturing steps are eliminated and the meter itself is adapted for manufacture and assembly by mass production methods.

Correspondingly, an object of this invention is a low cost moving coil meter or other instrument in which the meter movement can be readily assembled to provide a reasonably accurate instrument at low cost.

Another object is a meter including a base with locating surfaces to provide for mounting the supports for a moving coil in precise predetermined relation to the magnetic circuit and base.

Another object is a meter in which a supporting base is provided with both fixed locating surfaces and retaining elements, and in which support elements for the coil include locating and retaining portions which interengage with cooperating portions of the base to both position and retain the support elements on the base.

Another object is a moving coil assembly, as an intermediate product of manufacture, in which the coil assembly takes the form of a structure with integrally attached support elements which are subsequently severed from the coil from whereby the number of parts for the coil and its suspension are maintained at a minimum.

Another object is a moving coil instrument in which the coil support form and resulting intermediate product of manufacture, namely a coil with integrally attached suspension and zero adjusting elements, is uniquely adapted for use in an electric meter to be assembled by mass production methods.

Another object is a coil for a moving instrument in which the coil form is provided with integral portions to receive either bearing elements for mounting of the coil for rotation, or taut band support elements for suspending the coil for rotation, depending on the desired type of suspension for the meter to be constructed.

Another object is a unique moving coil for an instrument in which the coil form has integrally attached support elements for subsequent connection of bearings or a taut band, the coil is placed on the form and adhered thereto to fix portions of the form in spaced apart electrically insulated relation to other portions of the form, and coil terminals are provided separate electrically conducting paths for the ends of the coil.

Another object is a meter of the moving coil type in which the magnetic material yoke thereof is transversely split to facilitate assembly by mass production methods and simplify mounting the coil for rotation about a permanent magnet core.

An additional object is a meter of extremely rugged construction wherein the frame for the coil has integrally formed stops and is so dimensioned and arranged with respect to the magnetic circuit that the maximum extent of movement of the coil in any direction as a result of shock or impact is well within the elastic limit of the suspension elements for the coil.

An additional object is a combined zero adjust and support element of integral construction to which the taut band or spiral spring of the coil suspension is directly connected and which has integral gear teeth in mesh with gear teeth of the usual adjust knob, the integral element substantially reducing the number of required parts for the meter.

Another object is a meter construction in which the various parts are so arranged and constructed that during assembly of the meter each part can only be mounted in one possible position, whereby there is no chance for improper assembly.

An additional object is a unique damping ring arrangement for the coil which can be optionally provided at minimal additional cost.

Numerous other objects, advantages, and features of the invention will become apparent with reference to the accompanying drawings which form a part of this specification.

BRIEF DESCRIPTION OF THE DRAWINGS

FIG. 1 is an exploded pictorial view of the meter movement of this invention and its supporting base;

FIG. 2 is a top plan view of the meter movement and base with the upper yoke element and magnet removed and with portions of the base cut away for purposes of explanation;

FIG. 3 is a front elevational view of the meter movement with portions of the base cut away;

FIG. 6 is a side view in elevation of the taut band suspended coil assembly immediately before insertion into the base;

FIG. 7 is a side elevational view of the pivot bearing supported coil assembly immediately before insertion into the base;

FIG. 8 is an enlarged partial view in plan of a coil terminal of the coil form part; and FIG. 9 is a view corresponding to FIG. 8 and showing the terminal after it is fused to connect a coil end wire to the terminal.

THE METER MOVEMENT

Figure 4:
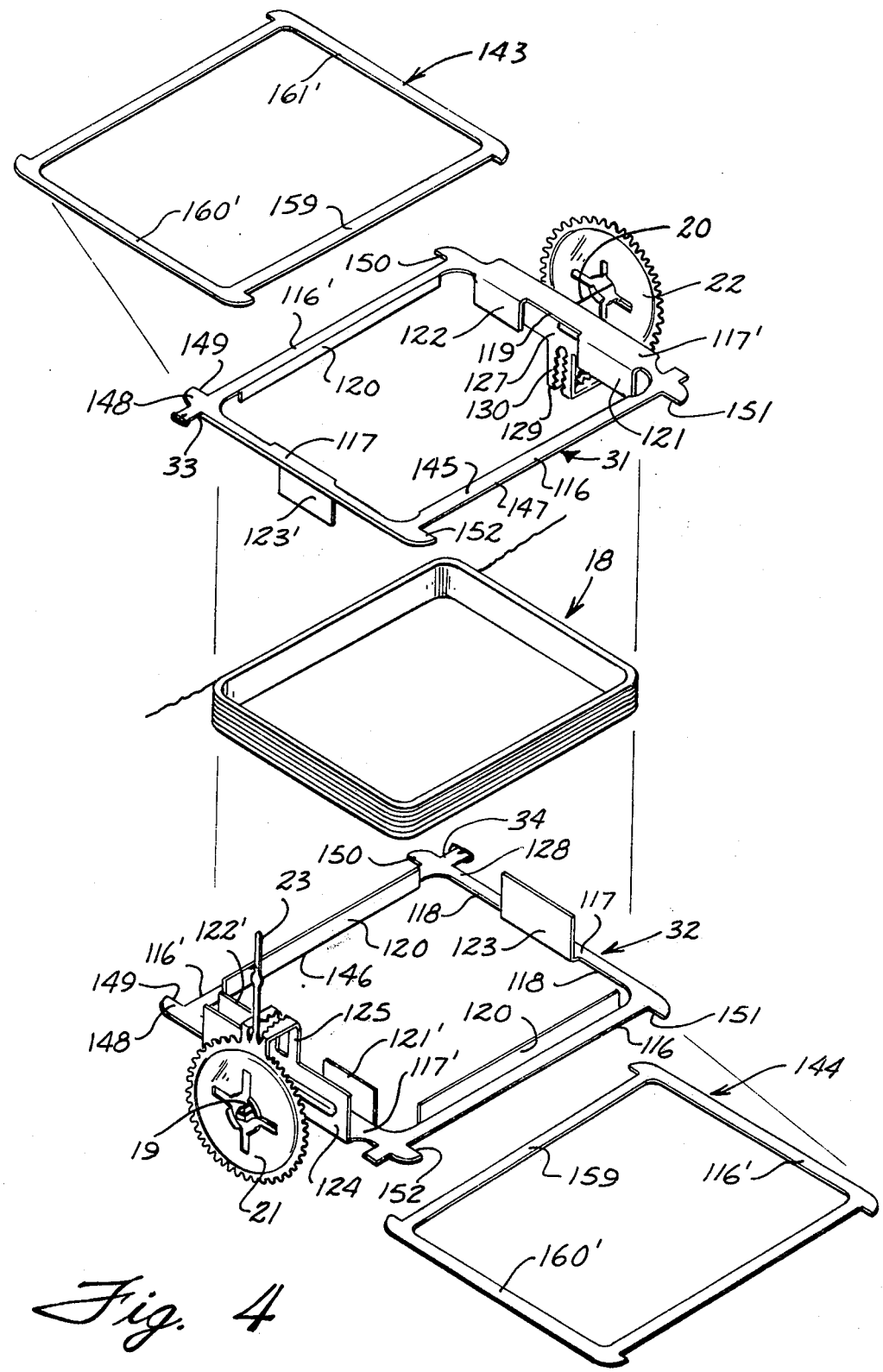
FIG. 4 is an enlarged exploded pictorial view of the coil assembly.

FIG. 1 shows a meter movement 3, and the manner in which the parts and sub-assemblies constituting the meter movement are assembled. A supporting base 10 supports all the components of meter movement 3. The magnetic circuit for the meter includes a lower yoke element 11 which is essentially semi-circular and an upper yoke element 12 which is identical to the lower yoke element and is merely the lower element turned 180° circumferentially. The yoke elements 11 and 12 are formed from soft iron or other magnetic material with magnetically non-retentive characteristics, and the yoke elements cooperate to form the usual yoke ring.

Positioned between yoke elements 11 and 12 is a permanent magnet 13. The contour of the surface of the permanent magnet 13 is such that generally crescent shaped gaps 14 and 15 (FIG. 3) are formed at each side of the magnet between the opposing surfaces of the yoke elements 11 and 12.

A moving coil assembly 16 includes a generally rectangular coil form 17 with a coil 18 wound on the coil form. The moving coil assembly is supported by taut bands 19 and 20 which are secured respectively to the front and rear of the coil assembly 16. The outer ends of the bands are secured respectively to gear toothed support elements 21 and 22. While a portion of this invention is directed to a meter having a coil suspended by taut bands, a quite similar coil assembly is used for a jewelled or pivot bearing version of the meter of this invention, as will subsequently be described in detail. Extending outwardly and upwardly from the front of coil assembly 16 is a staff 23 on which a hollow pointer 24 is mounted. At the rear of coil assembly 16 is a counterbalance weight 25 which counterbalances pointer 24.

Yoke elements 11 and 12 are dimensioned and configured to snap into supporting base 10. The magnet 13 is maintained in a clamped position between the yoke elements, and the coil assembly 16 extends around the magnet such that its longitudinal sides 26 and 27 extend respectively through the gaps 14 and 15.

Front support element 21 is rotatably supported in a front support structure 28 of base 10 and rear support element 22 is rotatably supported in a rear support structure 29 of the base. The support elements 21 and 22 are each of integral construction and each have gear teeth 30 so a desired one of these elements can be directly engaged by the spur teeth of a zero adjust knob, such as the zero adjust knob 7 of FIG. 2 to rotate the appropriate support element to zero adjust the pointer 24.

Coil form 17 includes two initially identical coil form parts 31 and 32 of electrically conductive material such as phosphor bronze. One end of the coil 18 is connected to a terminal 33 on coil form part 31 whereas the other end of the coil 18 is connected to terminal 34 on the coil form part 32. These coil form parts 31 and 32 are in insulated relation to each other so the respective taut bands 19 and 20 which are electrically connected to the respective coil parts act as conductors and carry the current for energizing the coil 18. The support elements 21 and 22 are each formed from an electrically conducting material and are electrically connected to the respective taut bands 19 and 20. External electrical connections to the support elements 21 and 22 can be made via the rigid terminal conductors 35 and 36 which are mounted on top of the base. As shown at FIG. 1, conductors 35 and 36 are each formed from flat strips of metal and have good electrically conducting characteristics.

Conductor 35 is electrically connected to front support element 21 by a flexible braided wire conductor 45. Similarly, rear support element 22 is electrically connected to conductor 36 by a braided wire 46. The braided wires 45 and 46 have sufficient flexibility that support elements 21 and 22 can be rotated a sufficient amount to zero adjust pointer 24.

THE SUPPORTING BASE

Base 10 is an integral structure molded from an electrically insulating plastic material with dimensionally stable characteristics, advantageously, a polysulfone material.

As shown at FIGS. 2 and 3, base 10 has a generally semi-circular hollow side wall 50 with a generally rectangular front flange 51. Front support structure 28 projects forwardly of front flange 51 and rear support structure 29 projects beyond end 52 of side wall 50. Front support structure 28 includes a pair of upwardly and inwardly directed integral legs 53 and 54. At the upper ends of these legs are inwardly extending horizontal blocks 55 and 56 which terminate in spaced relation to each other and have facing cylindrically curved surfaces 57 and 58 respectively each of which is greater than 90° in circumferential extent. Formed in the respective blocks 55 and 56 are arcuately curved recesses 59 and 60 which face each other and open upwardly to permit inserting front support element 21 downwardly into a seated position in the recesses, in a manner which will subsequently be described in detail. Recess 59 is defined in part by an upright inner wall 61 and recess 60 is defined in part by an opposed upright inner wall 62.

Rear support structure 29 is essentially the same as front support structure 28 and includes blocks presenting facing cylindrically curved surfaces 63 and 64 in the respective blocks 65 and 66, and recesses 67 and 68 to receive rear support element 22.

As shown at FIG. 2, the base also includes a curved yoke support pad 69 which projects upwardly from the bottom of side wall 50. The pad 69 is located generally centrally of the supporting base and provides a seat for yoke element 11. Between pad 69 and rear support structure 29 is a rear positioning post 70. Rear post 70 projects upwardly to a level above pad 69 and presents a front surface 71 which engages magnet 13 and lower yoke element 11 to both position and prevent movement of these elements in a direction toward rear support structure 29. Between pad 69 and front support structure 28 is a front positioning post 72 which has a pointed positioning projection 73 which faces toward surface 71 of the rear post, and also has a pair of locating surfaces 74 on each side of projection 73. On the forward side of post 72 is a recess 75 which has a generally cylindrical side wall interrupted at its bottom by an upwardly projecting stop 76. Recess 75 and stop 76 cooperate with zero adjust knob 7 to limit the extent of rotation of the knob.

Offset toward the front of side wall 50 and projecting upwardly from the side wall are a first pair of transversely aligned yoke retaining legs 79 and 80 which locate and secure yoke elements 11 and 12 in position on the supporting base 10. There are also a pair of transversely aligned rear yoke positioning and retaining legs 81 and 82 which project upwardly from side wall 50 and are offset toward the rear of the side wall. The locating and retaining legs 79-82 and the surfaces 71 and 74 of the positioning posts cooperate with the yoke elements and the magnet to both accurately position the magnet and yoke elements as well as to secure same to the base merely by pressing these parts into position. Legs 79 and 81 each have arcuate recesses 83 formed therein which present a downwardly facing yoke retaining edge 84, and similarly, legs 80 and 82 include arcuate recesses 85 which present a downwardly facing yoke retaining edge 86. In addition, the respective legs 79-82 include longitudinally facing yoke retaining surfaces 87-90 which provide additional surfaces for locating and positioning the yoke elements within supporting base 10.

By virtue of its construction, the supporting base is somewhat flexible along the central portion 91 of the side wall between the legs 53 and 54, yet the remaining portions of the side wall outwardly of legs 53 and 54 are quite rigid by virtue of the bracing obtained from the legs 79-82. Such flexibility along the center of the side wall facilitates assembly as will subsequently be described.

Yoke elements 11 and 12 cooperate to form a yoke ring of uniform cross-section which has inwardly facing cylindrical surfaces 110 and 111 on each side of magnet 13. The sides of the generally elliptical magnet 13 presents arcuately curved outwardly facing surfaces 112 and 113.

THE COIL ASSEMBLY AND TAUT BAND SUPPORT

Coil assembly 16 includes a coil form 17 comprised of an upper coil form part or half 31, and a lower coil form part or half 32 with a coil 18 mounted on the coil form. Initially the coil form parts 31 and 32 are identical. However, subsequent operations are performed on these coil form parts so there are differences at the time the coil assembly is installed in the base 10.

Both the upper and lower coil form parts 31 and 32 take the form of a hollow generally rectangular frame as shown at FIGS. 1, 2 and 4. Integral with upper coil form part 31 is the rear support element 22 and integral with lower coil form part 32 is the front support element 21. The various portions of the upper and lower coil form parts are initially integral with each other and are of the same thickness. This construction permits forming the respective parts from an initially flat uniform thickness sheet of metal with spring characteristics, such as phosphor bronze.

As shown in FIG. 4, the rectangular frame portion of upper coil form part 31 includes parallel side legs 116 and 116', a first end leg 117 which extends between the legs 116 and 116' at one end of the frame, and a second end leg 117' which extends between the legs 116 and 116' and at the other end of the frame. Since the lower coil part 32 has a rectangular frame portion which is merely the upper coil form part turned over end to end, the corresponding legs of the lower coil form part are designated by the same numerals 116, 116', 117, and 117'. The legs of the respective coil form parts are coplaner with each other. The openings defined by the legs 116, 116', 117, and 117' of the coil form parts are of the same size and are sufficiently large to extend around the magnet 13.

Projecting downwardly from the respective legs 116 and 116' of the upper coil form part 31 are elongated coil engaging flanges 120. Projecting upward from the respective legs 116 and 116' of lower coil form part 32 are elongated coil engaging flanges 120. These flanges of the respective coil form parts project toward each other in the same plane but have their end edges spaced apart as shown at FIG. 1. Upper coil part 31 has a pair of spaced apart tabs 121 and 122 (FIGS. 1 and 4), which project downwardly from leg 117' to the plane of lower coil part 32, and which extend into the recesses 118 of the lower coil part and terminate in spaced relation to the side edges of these recesses. Projecting upwardly from the leg 117 of lower coil part 32 is a tab 123 which extends into the recess 119 between tabs 121 and 122 but does not engage the sides of the recess so tab 123 is electrically insulated from upper coil part 31. The arrangement at the front of coil assembly 17 is the reverse of the tab arangement at the rear, there being a downwardly projecting central tab 123' on leg 117 of upper coil part 31 which projects downwardly between tabs 121' and 122' of lower coil part 32. By virtue of this configuration all portions of the upper coil part 31 are in spaced relation to all portions of the lower coil part 32 so these parts are in insulated relation to each other. The coil form parts are typically held together by the coil 18 of insulated wire, using for example, a suitable insulated bonding material.

Integral with leg 117' of lower coil part 32 is an upwardly projecting staff support plate 124 of substantial width. The staff support plate 124 is located in a plane in front of the outside edge of leg 117 of coil part 3 and has a pair of integral upwardly projecting legs 125 the inside edges of which are toothed, and which legs project first upwardly in the same plane as staff support plate 124, and then forwardly to mount staff 23 in a plane which includes front support element 21. It is to be appreciated that the staff is integral with the lower coil part 32, and initially, as shown in FIG. 4, support element 21 is also integral with the lower coil form part.

Projecting downwardly from the outside edge of leg 117' of upper coil part 31 is an integral rear support plate 127. Plate 127 is in a plane spaced behind the outside edge 128 of leg 117 of lower coil form part 32. Extending downwardly from plate 127 are a pair of spaced apart legs 129 (FIG. 4) provided with serrated edges or teeth 130 in facing relation along a portion of the length of the legs. Initially, legs 129 extend downwardly and then rearwardly and are integral with rear support element 22.

As will subsequently be described in detail, rear support element 22 is severed from legs 129 shortly before insertion of the coil assembly into base 10. Then, the legs 29 are straightened to provide a structure for receiving counter weight 25 between the teeth 130. The teeth 130 provide a means for securing counter weight 25 in position on the tail 131 provided by the legs 129. In addition, front support element 21 is severed from legs 125 shortly before insertion of the coil assembly into base 10.

The counterweight 25 (FIG. 1) takes the form of a disc of heavy material like lead which has slots 132 along its opposite sides to permit mounting the counterweight by sliding it upwardly between the legs 129. The counterweight is secured in the desired position by squeezing it so some of its material is forced into the spaces between teeth 130.

By virtue of this construction of the coil assembly, upper coil form part 31 is in insulated relation to lower coil form part 32. One end of coil 18 is connected to terminal 34 of lower coil part 32 and the lower coil part is electrically connected to the front support element 21 by the taut band 19. The other end of coil 18 is connected to terminal 33 of upper coil form part 31 and the upper coil part is electrically connected to the rear coil support element 22 by taut band 20.

As previously mentioned the coil form parts as well as front support element 21 and rear support element 22 are formed from thin electrically conducting material with springy characteristics, such as phosphor bronze. As shown at FIG. 2, support element 21 has an annular rearwardly projecting embossed ring 135 just inwardly of gear teeth 30. Ring 135 is sufficiently deep that it engages the walls 61 and 62 of the recesses 59 and 60, in which the support element is mounted. Ring 135 functions to press the support element forwardly into engagement with front surface 136 to frictionally retain the support element against inadvertent or accidental rotation but permits rotational adjustment of the support element. Projecting forwardly from the inner portion of support element 21 are four centering lugs 137–140 (FIG. 3). These lugs are each of arcuate curvature and have their outer surfaces concentric with the geometric center of the support element. The outer surfaces of these lugs have the same radius of curvature as, and engage the arcuate surfaces 57 and 58 of support structure 28 to maintain the support element in a precisely centered position. Extending from between lugs 139 and 140 is an integral taut band support finger 141 which projects forwardly and then curves inwardly so taut band 19, which is secured to finger 141, extends precisely along the axis of support element 21. The inner end of taut band 19 is connected to a support finger 142 integral with support plate 124 of lower coil form part 32.

During the initial stages of construction of coil form 17, upper coil part 31 is identical to lower coil part 32. Correspondingly, rear support element 22 is identical to front support element 21 and includes an embossed ring 135' (FIG. 2) as well as centering lugs 137'–140' which provide for rotational adjustment of rear support element 22 but maintain the rear support element in precisely concentric relation to the axis of the arcuate surfaces 63 and 64 of rear support structure 29 of the base. FIG. 2 shows the position of rear support element 22 with the centering lugs 138' and 139' in position on the surfaces 63 and 64. The outer end of rear taut band 20 is welded to a taut band support finger 141' integral with rear support plate 127.

As shown at FIG. 2, the side edges 147 of sides 26 and 27 of the coil assembly are spaced only slightly from the inside surface 110 of lower yoke element 11. In addition, each coil form part has at its corners transversely projecting lug portions 148 which provide stop surfaces 149–152 (FIGS. 2 and 4). These stop surfaces cooperate respectively with the front surface 99 and rear surface 99' of yoke elements 11 and 12 to limit the extent of fore and aft movement of the coil assembly, should the meter be subjected to shock or impact. The stop surfaces 149–152 and side edges 147 are so positioned relative to the front, rear, and inside surfaces of the yoke elements that the elastic limit of taut bands 19 and 20 is not exceeded regardless of the direction of shock or impact on the meter. In the event of transverse shock, edges 147 of the side legs 26 and 27 are sufficiently close to the inside surface 110 of the yoke elements that these legs will engage the surface before the elastic limit of either of the taut bands is exceeded. By virtue of this arrangement, the meter movement is virtually indestructible so far as damage to the taut bands from shock or impact is concerned.

By virtue of the torsional effect of taut bands 19 and 20, rotating either front support element 21 or rear support element 22 changes the at rest position of coil assembly 16, and correspondingly provides for adjusting the coil assembly and pointer to a zero position. Hence, support elements 21 and 22 can also be termed zero adjust elements. Adjustment of the zero position is preferably accomplished by the zero adjust knob 7 which has gear teeth 153 which mesh with the gear teeth 30 on front support element 21. The adjusting knob is provided with a semi-cylindrical rear tip 154 which extends into recess 75. The extent of rotation of the knob is limited by engagement of this tip with the stop projection 76 within the recess 75. The head of knob 7 has an annular recess 155 and cross slots 156 to enhance the resiliency of the head so it can be snapped into a knob retaining opening in a suitable cover to mount the knob for rotation.

THE DAMPING RINGS

Figure 5:
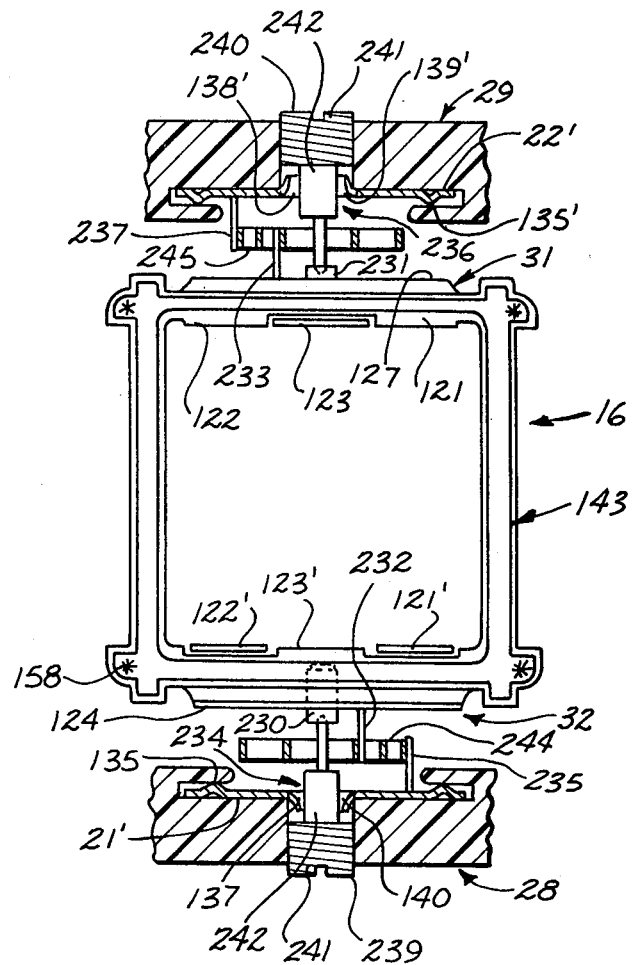
FIG. 5 is an enlarged partial top plan view showing a pivot bearing support arrangement for the meter.

An optional feature of the meter of this invention resides in the use of damping rings to decrease the rate of deflection of coil assembly 17 when coil 18 is energized. As shown at FIG. 4, two damping rings 143 and 144 can be provided. Damping ring 143 is placed on top of the flanged flat upper surface 145 of upper coil part 31 whereas damping ring 144 is placed on the bottom of the flanged flat lower surface 146 of lower coil part 32. These damping rings are welded respectively to the upper and lower coil parts for example, by use of spot welds 158 as shown at FIG. 5.

Damping rings 143 and 144 are identical to each other and have a configuration which is generally the same as the configuration of the upper and lower surfaces of the respective coil form parts 31 and 32. However, the respective sides 159 front 160' and rear 161' are slightly narrower than the configuration of the corresponding portions of the upper and lower coil form parts. Hence, as shown at FIG. 5, the damping rings have their side edges located respectively inwardly of the respective flanged surfaces of the coil form parts. By so dimensioning the damping rings 143 and 144 that their edges are inwardly of the respective edges of the coil form parts, damping rings of a desired thickness and damping capability can be added to the coil assembly without interfering in any way with the movement of the coil assembly. An additional significant feature of the dimensioning of the damping rings is to be observed with reference to FIG. 5 which also shows that the inner edges of the front 160' and the rear 161' of the damping rings are spaced outwardly of the respective tabs of the coil form parts to assure that the damping rings do not electrically connect the coil form parts together.

The damping rings are each formed from copper or other metal with good electrically conducting characteristics and which is also weldable. For simplicity of construction each of the damping rings is flat and has a uniform thickness. Similarly, each element of each coil form parts 31 and 32 is of the same thickness to simplify manufacture. Correspondingly, damping rings of the desired thickness can be readily added optionally for damping the deflection of the coil when the coil is energized.

Advantageously, staff support 23 has stop edges 164 at each side of staff 23 to limit the extent that the pointer can be pushed into position on the staff. The stop surfaces assure that the pointers of successively assembled meters will all be in the same position on the coil assembly, and this feature contributes to repeatable accuracy of the assembled meters.

THE PIVOT BEARING ARRANGEMENT

The meter thus far described has been one in which the coil assembly is suspended for pivotal movement by taut bands 19 and 20. A second version of a pivotal mounting for coil assembly 16 is the pivot bearing arrangement of FIG. 5. While FIG. 5 shows a top view of the coil assembly with the magnet, yoke pieces, and portions of the base deleted, it is to be understood that base 10 and the magnetic circuit including magnet 13 and the upper and lower yoke elements 11 and 12 are identical to those previously described for the taut band suspension version of the meter. With reference to FIG. 5 it will be observed that the upper and lower coil form parts 31 and 32 are essentially the same as the coil form parts previously described save that there are some minor modifications. These modifications are best explained with reference to FIGS. 2, 5 and 7. Front plate 124 of lower coil form part 32 is modified by deleting the taut band support finger 142 (FIG. 2) and providing an opening to receive and retain a pivot bearing 230 (FIGS. 5 and 7). Similarly, rear support plate 127 of upper coil form part 31 has its taut band support finger 146 deleted and is provided with an opening to receive and retain a rear pivot bearing 231.

An additional modification to front plate 124 is the provision of an integral tab 232 (FIGS. 5 and 7) which projects toward front support structure 28 of the base. There is also a tab 233 which projects toward rear support structure 29 and is integrally formed with rear plate 127.

The front support element 21' and rear support element 22' of the pivot bearing version of the meter are modifications of the support elements for the taut band version of the meter. Front support 21' is initially integral with upper coil form part 31, as is apparent with reference to FIG. 7. As will be apparent from the following discussion, the support elements 21' and 22' are more aptly termed zero adjust elements. Front element 21' is quite similar to the front support element 21, previously described. In this regard, there is an annular ring 135 which functions to frictionally restrain front element 21' from rotation, and there are also centering lugs 137–140 which center front element 21' in front support structure 28 (only the centering lugs 137 and 140 are shown at FIG. 5). The taut band support finger 141 (FIG. 2) of support element 21 is deleted in the case of support element 21' to provide an opening 234 (FIG. 5) through the center of support element 21'. In lieu of the previously described taut band support finger 141, front element 21' has an integral tab 235 which extends toward coil assembly 16. Similarly, in the case of rear element 22' there are centering lugs 138' and 139' which have an opening 236 therethrough and an integral tab 237 projects from the rear support element toward coil assembly 16.

The coil assembly of FIG. 5 is supported for pivotal movement by pivot studs 239 and 240. Pivot stud 239 has a pointed inner end which seats in a conical depression in the outer end of front pivot bearing 230 and similarly, pivot stud 240 has a pointed inner end that seats in a conical depression in the outside end of rear pivot bearing 231. The enlarged head 241 of both the pivot studs is external threaded and is of a diameter to be threaded into the opening defined by the curved surfaces 57 and 58 of front support structure 28 as well as into the opening defined by the curved surfaces 63 and 64 in rear support structure 29. The portion 242 of each stud which extends through the respective openings 234 and 236 is smaller than the opening so the front and rear elements 21' and 22' do not engage pivot studs 239 and 240 and hence, the studs do not interfere with rotation of the support elements 21' and 22' during adjustment of the zero position of coil assembly 16. In lieu of the bearing arrangement shown at FIG. 5 the ends of portions 242 of the studs can be provided with conical depressions to provide bearings, and shafts or studs with pointed tips can be fixed to coil assembly 16 in place of the bearings 230 and 231.

A spirally wound front leaf spring 244 is connected between front support element 21' and lower coil form part 32 by welding the inner end of the spring tab 232 and by welding the outer end of the spring to tab 235. Similarly, a spirally wound rear leaf spring 245 is both mechanically and electrically connected between rear support element 22' and upper coil form part 31 by welding the inner end of the spring to tab 233 and by welding the outer end of the spring to tab 237. The front and rear springs function as return springs to normally maintain the coil assembly in a zero position and to return the coil to this position after the assembled meter is de-energized. Zero adjustment of the coil is accomplished by rotating either the front support element 21' or the rear support element 22'. Where the assembled meter has a front zero adjust knob the knob is located in the cover (not shown). Where the zero adjust knob is at the rear of the meter the zero adjust knob can be located in a rear wall of a suitable casing of the meter.

THE COIL END TERMINALS

Another advantageous feature of the meter of this invention is the manner in which the ends of the wire of coil 18 are connected to the respective upper and lower coil form parts 31 and 32. FIG. 8 shows terminal 33 on an enlarged scale. As shown, the terminal is integral with upper coil form part 31, projects forwardly from one side of leg 117 of the coil form part, and has a slot 265 formed therein at the center of the T-shaped head 264. In addition, a V-shaped notch 266 is formed at the end of the slot 265 to facilitate guiding the wire from the coil end into the slot. The wire used to wind the coil is insulated with an insulation which deteriorates when heated, for example, a thermoplastic insulation. A first turn 267 of the wire is made across the corner of coil form part 31 and is brought under itself so a second turn 268 can be made which extends first across lug 148 whereupon the wire is then wrapped around terminal 34 and finally pulled into slot 265. Slot 265 is smaller than the diameter of the wire so the wire is temporarily mechanically held in position. No atempt is made to strip the thermoplastic insulation from the ends of the wire. Instead, terminal 34 is heated until it melts to form the ball 269 shown at FIG. 9. Such melting of the terminal 234 causes the insulation on the wire to deteriorate with the result that a good electrical and strong mechanical connection is obtained without stripping the wire by the mere expedient of melting the terminal. The terminal 34 of lower coil form part 32 is formed in the same manner.

ASSEMBLY

First the manner of assembly of the meter will be summarized and then the assembly steps will be described in greater detail. With reference to FIG. 2, assembly proceeds in the following manner. First, lower yoke element 11 is seated in the base. Next, coil assembly 17 is inserted in the base with the respective support elements 21 and 22 in the support structures 28 and 29 respectively of the base. Then, magnet 13 is inserted through the opening in the coil assembly to a seated position on yoke 11. Next, upper yoke element 12 is pressed downwardly into the base until it snaps into position. Then conductors 35 and 36 are pressed onto the top of the base. Then, pointer 24 is installed and the coil is statically balanced by adding the counterweight 25. Then, the front support element 21 and/or the rear support element 22 are rotated to coarsely set the zero adjustment of the pointer. Next, the flexible conductors 45 and 46 are welded between the respective support elements and conductors 35 and 36.

With this summary in mind, a more detailed description of the assembly of the meter will now be undertaken. As previously explained with reference to FIG. 3, the central portion 91 of base 10 is flexible and by virtue of this flexibility forces exerted on the sides of the base outwardly in the direction of the arrows 260 cause the center part of the base to flex with the result that the yoke retaining legs 79 and 81 move away from the legs 80 and 82. In addition, the blocks 55 and 56 at the front of the base as well as the blocks 65 and 66 at the rear of the base are spread apart a distance somewhat greater than the outside diameter of the centering lug portions of the front and rear support elements. So spreading the base permits lower yoke element 11 to be easily inserted into the base and also permits inserting the front and rear support elements and the coil simultaneously by a simple downward movement of the assembly of FIG. 6 into the base. By virtue of the notch 106 in the lower yoke element and the arrangement of the posts 70 and 72, the yoke element can only be installed in the base with notch 106 adjacent post 72, as shown at FIG. 2.

FIG. 6 shows the condition of the taut band suspension version of the coil assembly immediately before it is inserted into base 10. As shown at FIG. 6, coil 18 is in position between the respective upper and lower coil form parts 31 and 32. As will be recalled with reference to FIGS. 2 and 4, front support element 21 was initially integral with lower coil form part 32 and rear support element 22 was initially integral with upper coil part 31. To separate front support element 21 from lower coil form part 32 a short section 250 of the metal between staff support 163 and support element 21 is cut away as shown at FIG. 6. At rear support element 22 an L-shaped section 251 is cut away and the remaining horizontal portion of the legs 129 are bent downwardly to provide a straight rearwardly inclined tail 131 to receive the counterweight 25. With the assembly in the condition of FIG. 6 and with the counterweight 25 in position this assembly is ready for insertion into base 10.

With coil assembly 17 at the stage of manufacture shown at FIG. 6, the coil assembly can be inserted in the base only with front support element 21 in front support structure 28 and rear support element 22 in rear support structure 29. If the coil assembly is turned around so it faces backwards when assembly is attempted, the bottom of tail 131 of the coil assembly will strike front post 72 of the base and cannot be properly inserted. However, when the coil assembly is properly oriented with pointer receiving staff 24 at the front of the base, tail portion 131 is above recess 92 at the rear of the base and is behind rear locating post 70. Hence, when the coil assembly and support elements are simultaneously inserted in the base, tail portion 131 is located in the region of the recess and the coil assembly can be inserted with no difficulty.

Installation of magnet 13 is accomplished merely by inserting the magnet downwardly into the base to the position shown at FIG. 3 so its lower rectangular end 105 seats in slot 103' of lower yoke element 11. Notch 107 of the magnet prevents its installation except with this notch adjacent projection 73 of locating post 72. Upper yoke element 12 can also only be installed in one position because of the steps 96 and 97 of the upper yoke element and the corresponding steps 96' and 97' of the lower yoke element. If the upper yoke element is improperly oriented it cannot be pressed downwardly into the base a sufficient distance to allow the retaining edges 84 and 86 of the yoke retaining legs 79–82 to snap into the notches 98.

Conductors 35 and 36 are then installed by pressing these conductors into position so the posts 41 and 43 extend through the respective openings 42 and 44 of the conductors to secure the conductors on the base in predetermined positions. A coarse adjustment of front and rear elements 21 and 22 is made to approximately adjust the zero position of coil assembly 17. After this coarse adjustment is made braided conductor 45 is welded between conductor 36 and front support element 21 and braided conductor 46 is welded between conductor 35 and rear support element 22. The braided conductors 45 and 46 are sufficiently flexible that the front and rear support elements can be rotated for zero adjustment of the coil after these wires are secured to the respective support elements. Hence, either a front or a rear zero adjust arrangement can be optionally provided for the meter movement. Next, pointer 24 is pushed onto staff 23. No cement is required because the pointer is frictionally retained on the staff by its elasticity. Next, the meter movement is statically balanced. Counterweight 25 is initially installed on tail 131 by very lightly crimping this counterweight. This permits the counterweight to be moved to a different position, if necessary, during the final static balancing of the moving coil assembly. In addition, additional smaller weights can also be added and crimped in position to obtain a perfect static balance. Such changing of the position of balance weight 25 as well as adding weights to tail 131 can be easily accomplished because of the opening 92 at the rear of the base which provides for access to the lower end of tail 131 from below the base.

The assembly described has been for the taut band version of the meter. With regard to the pivot bearing version of the meter, the assembly steps are substantially the same. With reference to FIG. 7, there is shown the coil assembly for the pivot bearing version of the meter immediately prior to insertion into the base. As shown, a short section 255 has been clipped away from between staff support 163 and front support element 21'. In addition, a short L-shaped section 256 at the rear of the assembly has been clipped away and tail 131 has been provided so it extends downwardly and is slightly inclined rearwardly. Counterweight 25 is also installed. In addition, the front and rear spiral return springs 244 and 245 have been secured between the coil assembly and the respective front support element 21' and rear support element 22'.

The manner of assembly for the pivot bearing version is essentially the same as for the taut band version in that the base is spread apart slightly, lower yoke element 11 is inserted, the assembly shown at FIG. 7 is then inserted downwardly into the base 10 so the centering lugs of the respective front and rear elements are within the arcuate surface openings of the front and rear support structures of the base and the base is then released so it closes by its own resiliency to accurately center the support elements in the front and rear structures.

An additional step required for assembly of the pivot bearing meter is the installation of the pivot screws 239 and 240. During the installation of the screws the coil assembly is held along the desired axis of rotation and the screws are tightened until the pointed tips of the screws seat in the conical depressions in the respective bearings 230 and 231. The remaining assembly steps including the installation of the magnet, the upper yoke element, and the conductors is precisely the same as previously described for the taut band version of the meter.

While several preferred embodiments of coil construction of the meter of this invention have been shown and described in detail it is to be understood that numerous changes can be made in the constructions and techniques described herein without departing from the spirit and scope of this invention as defined herein and in the appended claims.

I claim:

1. A moving coil instrument comprising: a first unitary electrically conductive coil form part, a second unitary electrically conductive coil form part mounted adjacent, and in spaced, electrically insulated relation to the first coil form part, coil support means on the coil form parts, a coil extending around the coil support means and bridging said coil form parts, said coil including a winding having ends electrically connected respectively to said coil form parts, said coil form parts and coil comprising a coil assembly; first and second coil assembly supports; support means mounting said coil assembly supports in electrically insulated relation to each other; electrically conductive means connected between said first coil form part and said first support, and between said second coil form part and said second support, so that an electrical connection can be made to said coil from said supports.

2. An instrument according to claim 1 wherein said support means is a base of electrically insulating material.

3. An electrical instrument according to claim 1 wherein said electrically conductive means comprises a first taut band suspension element connected between said first coil form part and said first support, and a second taut band suspension element connected between said second coil form part and said second support.

4. An instrument according to claim 1 wherein said support means mounts at least one of said supports for rotational adjustment.

5. An instrument according to claim 1 wherein said coil form parts each comprise a flange, and leg means projecting from said flanges; said coil form parts being assembled with said flanges in spaced apart relation, and said projecting legs extending toward the respective flanges said coil being disposed between the flanges of, and supported on the legs of the coil form parts.

6. An instrument according to claim 1 wherein a counterweight support is integral with one of the coil form parts.

7. An instrument according to claim 6 wherein said counterweight support comprises leg means presenting a toothed surface for crimping a counterweight onto the leg means.

8. An instrument according to claim 1 wherein said first coil form part further comprises an integral pointer support.

9. An instrument according to claim 8 wherein said second coil form part further comprises an integral counterweight support.

10. An instrument according to claim 1 further comprising, taut band support means integral with said first coil form part; and taut band support means integral with said second coil form part.

11. An instrument according to claim 10 wherein said first and second coil assembly supports are each electrically conductive support elements, initially integral respectively with said first and second coil form parts; and severable connecting means between said support elements and coil form parts for separating said support elements from the coil parts upon severing of the connecting means.

12. An instrument according to claim 1 wherein said coil assembly is mounted for rotation about a predetermined axis by said coil assembly supports, and the instrument further comprises, magnetic circuit means having surfaces transverse to the axis of rotation of the coil; and stop means integral with said coil form parts and engageable with said transverse surfaces of the magnetic circuit to limit movement of the coil assembly in a direction along its axis, in the event of shock to or vibration of the instrument.

13. An instrument according to claim 12 wherein said magnetic circuit includes second surfaces facing the axis of rotation of the coil assembly; and stop means on said coil form parts in opposed relation to said second surfaces of the magnetic circuit for limiting movement of the coil assembly in a direction transverse to its axis of rotation.

14. An instrument according to claim 13 wherein said coil form parts each include a flange, said parts are assembled with said flanges spaced from each other, and said stop means comprise tabs projecting from said flanges of said coil form parts.

15. A moving coil instrument comprising: a first unitary electrically conductive coil form part, a second unitary electrically conductive coil form part, said coil form parts being in adjacent, spaced apart, electrically insulated relation to each other, a coil of a predetermined configuration, coil support means integral respectively with the coil form parts and cooperating to define the configuration of the coil, said coil being mounted on said support means of the coil form parts and including a winding having ends electrically connected respectively to said coil form parts, first and second coil assembly supports; support means mounting said coil assembly supports in electrically insulated relation to each other; electrically conductive means connected between said first coil form part and said first support, and between said second coil form part and said second support, so that an electrical connection can be made to said coil from said supports.

16. An instrument according to claim 15 wherein, said coil is rectangular, and said coil support means of said coil form parts include support legs extending into said coil from each of said coil form parts, said support legs of the respective coil form parts being spaced from each other and cooperating to define a general rectangular coil support.

17. An instrument according to claim 16 wherein, each coil form part comprises a single piece of formed sheet metal.

18. A moving coil instrument according to claim 1 wherein, said coil form parts comprise a coil form; and damping ring means of a configuration generally corresponding with the configuration of said coil form, at a location to one side of said coil, and secured to the coil form.

19. A coil assembly according to claim 18 wherein said coil form comprises a weldable metal; said damping ring means comprises a weldable metal; and said damping ring means is welded to said coil form.

20. A coil assembly according to claim 18 wherein said damping ring means includes, a first damping ring at one side of said coil, and connected to said coil form, and a second damping ring at the opposite side of said coil and connected to said coil form in generally spaced parallel relation to said first damping ring.

21. A coil assembly according to claim 18 wherein said coil assembly is the moving element of a D'Arsonval type meter; said coil is of generally rectangular configuration; said coil form is generally rectangular; and said damping ring means includes first and second generally flat ring elements secured respectively to opposite sides of said coil form.

22. A coil assembly according to claim 18 wherein said damping rings each have an opening therein greater than an opening in said coil form; and said damping rings are secured to said coil form with the openings therein aligned with the opening in said coil form so that there is an unobstructed opening through said coil assembly of at least the size of the opening in said coil form.

23. A coil assembly according to claim 18 wherein each coil form part includes a flange, and said coil support means on said coil form parts comprises tab means extending respectively from the flange of the first coil form part toward the flange of the second coil form part; said coil connecting said coil form parts together in insulated relation to each other; said tab means defining an opening in said coil form; said damping ring means having an opening therein greater than said opening in said coil form with the inner edges thereof at a location beyond said tab means of said coil form parts, so that the damping ring means is spaced from the tab means.

* * * * *